(12) United States Patent
Shin et al.

(10) Patent No.: US 7,510,951 B2
(45) Date of Patent: Mar. 31, 2009

(54) METHOD FOR FORMING HIGH-RESOLUTION PATTERN WITH DIRECT WRITING MEANS

(75) Inventors: Dong-Youn Shin, Daegu (KR); Bu Gon Shin, Daejeon (KR)

(73) Assignee: LG Chem, Ltd., Seoul (KR)

(*) Notice: Subject to any disclaimer, the term of this patent is extended or adjusted under 35 U.S.C. 154(b) by 220 days.

(21) Appl. No.: 11/431,922

(22) Filed: May 11, 2006

(65) Prior Publication Data
US 2006/0281333 A1 Dec. 14, 2006

(30) Foreign Application Priority Data
May 12, 2005 (KR) .................. 10-2005-0039774
Dec. 26, 2005 (KR) .................. 10-2005-0129694

(51) Int. Cl.
H01L 21/20 (2006.01)
H01L 21/36 (2006.01)
(52) U.S. Cl. .................. 438/478; 257/E21.236
(58) Field of Classification Search .................. 438/584, 438/478
See application file for complete search history.

(56) References Cited

U.S. PATENT DOCUMENTS 6,881,687 B1* 4/2005 Castrucci .................... 438/795
7,211,464 B2* 5/2007 Lieber et al. ................. 438/99
2006/0008627 A1* 1/2006 Nyholm et al. ............. 428/209

FOREIGN PATENT DOCUMENTS

| EP | 0 880303 A1 | 11/1998 |
|---|---|---|
| JP | 06-053106 | 2/1994 |
| JP | 07-057988 | 3/1995 |
| JP | 07-099216 | 4/1995 |
| JP | 11-112045 | 4/1999 |
| JP | 11-238797 | 8/1999 |
| KR | 10-2000-0005446 | 2/2000 |
| KR | 10-2004-0028972 | 4/2004 |

* cited by examiner

Primary Examiner—W. David Coleman
(74) Attorney, Agent, or Firm—McKenna Long & Aldridge

(57) ABSTRACT

A patterning method comprising (a) providing a substrate having a sacrificial layer made of a first material, partially or totally formed on the substrate, (b) forming pattern grooves, which are free from the first material and have a line width of a first resolution or lower, on the sacrificial layer by using a first means, by which the sacrificial layer is directly processed to form a line, (c) filling the pattern grooves with a second material to a second resolution by using a second means, to form a pattern of the second material on the substrate. This method provides a high-resolution pattern with little or no waste of the second material, thereby reducing production costs. The method uses first high resolution means, such as focused energy beams of laser, combined with a low resolution means, such as ink-jet, to efficiently provide a high-resolution pattern.

16 Claims, 8 Drawing Sheets

FIG. 2
1 : transfer film
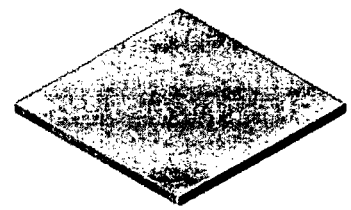
2 : transfer layer coating
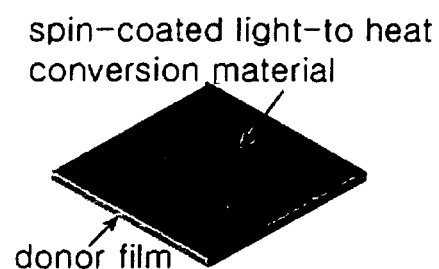
spin-coated light-to heat conversion material
donor film
3 : functional material coating
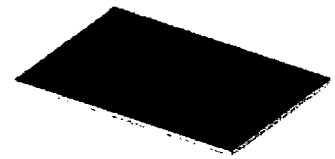
4 : adhesion onto substrate and laser transfer
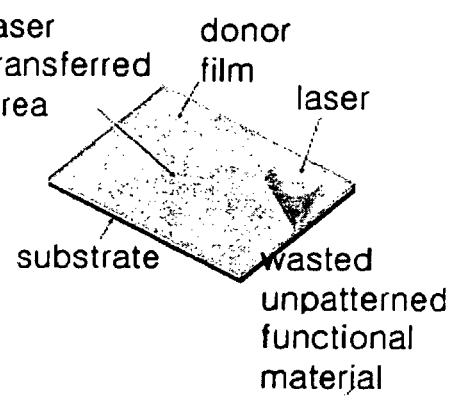
laser transferred area
donor film
laser
substrate
wasted unpatterned functional material
5 : donor film removal
6 : finished pattern
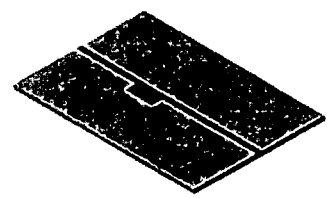

METHOD FOR FORMING HIGH-RESOLUTION PATTERN WITH DIRECT WRITING MEANS

This application claims the benefit of the filing date of Korean Patent Application No. 10-2005-0039774, filed on May 12, 2005, and No. 10-2005-0129694, filed on Dec. 26, 2005 in the Korean Intellectual Property Office, which are incorporated herein in their entirety by reference.

TECHNICAL FIELD

The present invention relates to a method for forming a high-resolution pattern and a substrate having a pre-pattern formed by the same method.

BACKGROUND ART

Photolithography has been widely used as a method for forming a high-resolution pattern used in electronic devices. However, photolithography is wasteful in terms of consumption of materials; is a multistep process; comprises a complicated process using a photoresist, a developer and an etchant, thereby showing poor processing efficiency; and requires a large-area mask, resulting in poor applicability of a new design for photolithography to actual production lines. Therefore, in order to solve the aforementioned problems of photolithography, an ink-jet process has been developed as a method for forming a pattern directly onto a substrate without a mask, while minimizing the number of processing steps and waste of materials.

EP-A-O 880303 and Korean Laid-Open Patent No. 2004-28972 disclose a method for forming a pattern directly by way of an ink-jet process without a mask. FIG. 1 is a schematic flow chart for the method for forming a pattern by an ink-jet process. However, the above method provides too low of a resolution to be applied to microelectronic devices or the like. Also, the above method is problematic in that as the size of ink drops decreases, positional error in a pattern increases relatively to the size of ink drops loaded onto a substrate, thereby causing a fatal open circuit or short circuit.

Additionally, Korean Laid-Open Patent No. 2000-5446 discloses a method for forming a pattern directly by using a laser. FIG. 2 is a flow chart showing the method for forming a pattern by using a laser patterning process. As shown in FIG. 2, an LTHC (light-to-heat conversion) material is coated onto a transfer film via a spin coating process or the like to form an LTHC layer (transfer layer); a composition, comprising functional materials and additives for controlling adhesion, is coated onto the top of the LTHC layer via a spin coating process or the like to provide a donor film; the donor film is adhered to a substrate; a pattern is transferred by laser irradiation; and then the donor film is removed after the transfer step to provide a high-resolution pattern. However, the aforementioned method is problematic in that a separate donor film is required, resulting in an increase in the cost; functional materials for patterning are coated totally onto the donor film, resulting in waste of functional materials; the additives added to the functional materials may cause degradation in the quality of the materials; interface between the donor film and the substrate may be contaminated upon the adhesion thereof; and the materials may be deteriorated due to high temperature generated by a laser.

Meanwhile, other patterning methods using a laser include laser ablation. However, a laser ablation process is problematic in that ablation efficiency for a particular laser wavelength depends on the quality of a pattern to be ablated; dose of a laser should be precisely controlled; and a pattern and a preliminarily formed pattern may be damaged upon the patterning of a multilayer structure.

DISCLOSURE OF THE INVENTION

Therefore, the present invention has been made in view of the above-mentioned problems. It is an object of the present invention to provide a method for forming a pattern, which enables high resolution patterning, shows high processing efficiency and causes little waste of high-cost functional materials. It is another object of the present invention to provide a substrate having a pre-pattern formed by the same method.

According to an aspect of the present invention, there is provided a method for forming a pattern which comprises the steps of:

(a) providing a substrate having a sacrificial layer made of a first material, partially or totally formed on the substrate;

(b) forming pattern grooves, which are free from the first material and have a line width of a first resolution or lower, on the sacrificial layer by using a first means, by which the sacrificial layer is directly processed to form a line;

(c) filling the pattern grooves with a second material to a second resolution by using a second means, to form a pattern of the second material on the substrate; and (d) optionally, removing the remaining sacrificial layer.

According to another aspect of the present invention, there is provided a substrate having a pre-pattern, which has a sacrificial layer made of a first material partially or totally formed on a surface thereof, wherein the sacrificial layer comprises pattern grooves, which is directly processed to form a line by using a first means, are free from the first material and have a line width of a first resolution or lower, the pattern grooves are filled with a second material to a second resolution by using a second means.

Hereinafter, the present invention will be explained in more detail.

FIG. 3 is a schematic flow chart for a method for forming a pattern according to a preferred embodiment of the present invention. Hereinafter, the method according to the present invention will be explained in more detail with reference to FIG. 3.

(1) Step (a): Step of Providing Substrate Having Sacrificial Layer Made of First Material, Partially or Totally Formed on Substrate Methods for forming a sacrificial layer onto a substrate include conventional methods for forming a film, generally known to one skilled in the art.

The first material for forming the sacrificial layer may be applied totally onto the surface of the substrate by way of a non-pattern directed coating process, such as a slit coating/spin coating process. Otherwise, the first material may be applied partially onto the surface of the substrate by way of a pattern directed coating process, such as a screen printing, roll printing or ink-jet printing process.

When the first material for forming the sacrificial layer is in a liquid or semi-solid state, an ink-jet process, a printing process, a screen printing process, an electrostatic printing process, an off-set printing process, a gravure printing process, a flexography process, a printing process using a soft mold, a spin coating process or a slit coating process may be used. On the other hand, when the first material for forming the sacrificial layer is in a solid state, the first material may be applied by way of a sputtering process using focused ion beams or plasma. Further, when the first material for forming the sacrificial layer is in a solid state or a semi-solid state, the material may be formed into a film shape, and then the film is transferred onto the substrate by using a laser, so that it can be applied directly to the substrate.

Particularly, when the first material for forming the sacrificial layer is expensive, it is possible to perform patterning of the sacrificial layer on the substrate, to a resolution different to the resolution of pattern grooves to be formed by using an ink-jet process (i.e. a direct patterning process), preferably to a resolution lower than the resolution of the pattern grooves.

Preferably, after the sacrificial layer is applied to the substrate, the resultant substrate is dried. This is because a sacrificial layer present in a liquid state is not amenable to formation of pattern grooves and to filling of the pattern grooves with functional materials.

Meanwhile, the sacrificial layer may be formed on a substrate comprising previously patterned regions.

(2) Step (b): Step of Forming Pattern Grooves, which are Free from First Material and Have Line Width of First resolution or lower, on Sacrificial Layer by Using First Means by Which Sacrificial Layer is Directly Processed to Form a Line In step (b), the sacrificial layer is directly processed to form a line in a desired pattern so as to form high-resolution pattern grooves free from the first material.

According to the patterning method of the present invention, the first material for forming the sacrificial layer is applied selectively or totally onto a substrate in a liquid state (e.g., ink), and then is partially removed directly by using laser, etc., to form a micropattern. Hence, the present invention avoids a need for a photoreaction that has been required for a conventional photoresist, such photoreaction causes monomers/oligomers to be polymerized by photons and a photoinitiator. For example, PVA, PMMA or PVP may be used as the first material for forming the sacrificial layer according to the present invention, although they are not photoresists.

The first means for forming the high-resolution pattern grooves includes focused energy beams capable of focusing of a large amount of energy into a small area. Particular examples of the first means include E-beams, focused ion beams, laser, and a huge-output lamp used in combination with an optical system. Any suitable means can be selected so as to remove the first material for forming the sacrificial layer.

As used herein, the term "huge-output lamp" refers to a high-output lamp that emits light with a desired wavelength, such as a UV lamp or an IR lamp. It is sufficient for the huge-output lamp to provide such energy output as to remove the sacrificial layer efficiently when the light beams are focused by using a focusing device such as a lens.

The portions, from which the sacrificial layer is selectively removed in the form of high-resolution pattern grooves, correspond to the portions to be filled finally with a secondary material for forming a pattern, such as a functional material, in a pattern directed manner, i.e. the portions in which the second material remains as a high-resolution pattern.

Although a method of maskless direct energy beam writing may be used as the first means for forming pattern grooves on the sacrificial layer, a diffractive optical element or a mask may be partially used in order to control the shape of beams in a manner favorable to the patterning, when using laser beams as the first means. For example, a mask-based laser scanning process or a diffractive optical element may be used to form pattern grooves on the sacrificial layer in a complicated shape (see FIG. 4c).

Herein, the mask refers to a mask, which is disposed in a path of laser beams and is locally used in order to control the shape of beams irradiated to the substrate, instead of a mask used for large-area patterning in conventional lithographic processes. To control the shape of beams, a diffractive optical element is preferred to a mask, but is not limited thereto.

The resolution of the diffractive optical element or the mask is preferably higher than the first resolution or lower that can be realized by the first means.

According to the present invention, the resolution of the pattern grooves can be realized to such a degree that the minimum line width which can be patterned directly by using focused energy beams such as laser is attained. Depending on the patterning device, the minimum line width may reach a sub-micrometer level. On the contrary, the maximum line width may range from several hundred micrometers to several thousand micrometers.

When the first material for forming the sacrificial layer is removed by the heat generated by laser via decomposition/evaporation, a laser with a wavelength corresponding to the range of visible rays or infrared rays is generally used. On the other hand, when the first material is removed by cleaving chemical bonds, a laser with a wavelength corresponding to the range of ultraviolet rays is preferred.

If the first material for forming the sacrificial layer shows the maximum light absorption spectrum in the range of applied wavelengths of laser, it may be removed with no additives that assist light absorption. However, it is possible to facilitate the removal of the first material by using additives that show the maximum light absorption spectrum in the range of the applied wavelengths. Such light absorbing agents as additives preferably have a high solubility to the solvent capable of dissolving the first material for forming the sacrificial layer.

(3) Step (c): Step of Filling Pattern Grooves with Second Material to a Second Resolution by Using Second Means The pattern grooves are filled with a second material, such as a functional material, which forms a final pattern.

Step (c) is performed preferably by using a second means capable of direct patterning. The term "direct patterning" in step (c) refers to application of a final pattern-forming material directly to a desired position.

Direct patterning is an additive process rather than a subtractive process such as photolithography. Particularly, in the case of direct patterning based on ink-jet or laser, CAD (computer aided design) to drawing is allowed.

When using the second means capable of direct patterning, the second material for forming a pattern can be applied partially to desired portion, not totally to the substrate. Hence, it is possible to significantly reduce the consumption of the second material for forming a pattern (e.g. a functional material) compared to a conventional patterning method using an LTHC donor film.

The present invention is characterized in that high-resolution pattern grooves are formed by using a first means with a high resolution, and a high-resolution pattern formed of a second material for forming a pattern can be obtained by using the pattern grooves, even if a second means with a low resolution is used to form the pattern on a substrate with the second material for forming the pattern.

In step (c), the pattern grooves formed in step (b) are filled with the second material to a second resolution. The second resolution is preferably lower than the line width of the pattern grooves. However, if desired, the second resolution may be similar to or higher than the line width of the pattern grooves.

In general, the first resolution is higher than the second resolution. If desired, the first resolution may be similar to or lower than the second resolution. For example, the first resolution may be less than 50 μm and the second resolution may be 50 μm or more.

The second means for filling the pattern grooves with the second material includes a conventional method for forming a film with no particular limitation. For example, a liquid or semi-solid functional material may be applied by using a pattern directed process, such as an ink-jet process, a printing process, a screen printing process, an electrostatic printing process, an off-set printing process, a gravure printing process, a flexography process, or a printing process using a soft mold. Meanwhile, a solid or semi-solid functional material may be directly applied by using laser, plasma or focused ion beams.

Particularly, use of an ink-jet process, which is a direct patterning process, as the second means for filling the pattern grooves with the second material is preferred due to the reduced consumption of the second material.

Meanwhile, when a low-molecular weight polymer (with a molecular weight of 20,000 or less) is used as the material for forming the sacrificial layer, and the portions, to which the second material for forming a pattern is applied, are removed by laser to form pattern grooves, the pattern grooves have clean edge portions, as shown in FIG. 5.

As shown in FIG. 7, because of the difference in the wettability of the sacrificial layer and that of the substrate with the second material for forming the pattern, namely, the difference in the surface energy, the second material may be self-aligned in the regions free from the sacrificial layer, or the second material, by drying, may be separated between the regions free from the sacrificial layer and the regions on the top of the sacrificial layer. Such self-alignment or separation of the second material can facilitate removal of the second material remaining in/on sacrificial layer in the following step (d).

Meanwhile, when a high-molecular weight polymer (with a molecular weight of greater than 20,000) is used as the material for forming the sacrificial layer and the portions, to which the second material for forming a pattern is applied, are removed by laser to form pattern grooves, the pattern grooves have a partition at the edge portions thereof, as shown in FIG. 6.

As shown in FIG. 8, because of the difference between the wettability of the sacrificial layer and that of the substrate with the second material for forming a pattern, the second material may be self-aligned in the regions free from the sacrificial layer, or the second material may be dried to cause separation of the second material between the regions free from the sacrificial layer and the regions on the top of the sacrificial layer. Such self-alignment or separation of the second material on the top of the sacrificial layer in the presence of a partition, can facilitate removal of the second material remaining in/on the sacrificial layer in the following step (d).

(4) Step (d): Step of Removing Remaining Sacrificial Layer

The sacrificial layer remaining after forming a pattern of the second material in the pattern grooves may be removed simultaneously with the removal of the second material remaining undesirably on the top of the sacrificial layer. By doing so, only the pattern of the second material, formed by the high-resolution pattern grooves, can be present on the substrate.

As the methods for removing the sacrificial layer, the following methods may be used. First, when the first material for forming the sacrificial layer is a material that can be dissolved in a suitable solvent, it can be removed directly by using a solvent with no use of focused energy beams. Next, when the first material for forming the sacrificial layer can be removed from the substrate via vaporization or thermal decomposition even under a sufficiently low energy density, it can be removed by using a huge-output lamp, a drying furnace or a baking furnace capable of irradiating such energy for a predetermined period of time. In addition to the above methods, the first material for forming the sacrificial layer can be removed by using light irradiation such as focused energy beams that can be used to form the pattern grooves on the sacrificial layer. Preferably, in the case of an OLED/PLED, sensitive to moistures or solvents, a dry process may be used to remove the sacrificial layer. In other general cases, a wet process may be used to remove the sacrificial layer.

Preferably, a solution or a solvent, which can selectively dissolve the first material for forming the sacrificial layer therein, while not dissolving the second material for forming the pattern, may be used.

In the case of a wet process for removing the sacrificial layer, there is no particular limitation in the solvent or the solution, as long as the solvent or the solution can dissolve the material forming the sacrificial layer selectively, while not dissolving other functional materials. For example, when the main material for forming the sacrificial layer is water soluble PVA or PVP, a polar solvent such as an aqueous solution may be used as the solvent. On the other hand, when the main material for forming the sacrificial layer is water insoluble PMMA, a non-polar solvent such as 1,2-dichloroethane may be used.

In order to remove the first material for forming the sacrificial layer selectively by using the solvent, it is preferable that the first material for forming the sacrificial layer and the second material for forming the pattern have different polarity, so that both materials are not soluble to each other and have different solubility to a specific solvent.

(5) Step (e): Step of Forming and Removing Protective Layer

The method according to the present invention may further comprise: a step of forming a protective layer on the top of the sacrificial layer, after step (a) of forming the sacrificial layer, and removing the protective layer after step (b); or a step of forming a protective layer on the top of the second material layer for forming a pattern, after step (c) of applying the second material, and removing the protective layer after step (d).

When the first material for forming the sacrificial layer and/or the second material for forming a pattern, which remains on the top of the sacrificial layer, is removed in step (b) or step (d), a protective layer may be further applied after the application of the first material on the top of the substrate or the application of the second material for forming a pattern, in order to prevent the first material/the second material from adhering back to a previously patterned region or to the substrate and from contaminating the same.

(6) Method for Partially Forming High-Resolution Pattern

FIG. 4 is a schematic flow chart for a method for partially forming a high-resolution pattern according to a preferred embodiment of the present invention.

In step (c), while the pattern grooves having a first resolution or lower are filled with the second material for forming a pattern to a second resolution by using the second means (e.g. ink-jet) capable of direct patterning, a pattern of the second material may be formed on additionally the regions free from the sacrificial layer to the second resolution and/or a third resolution, so that the pattern having the first resolution can be formed simultaneously with the formation of the pattern having the second resolution and/or the third resolution. In this case, regions not requiring the highest resolution, for example, regions requiring a line width of 50 μm or more are patterned directly by ink-jet, and the resolution is variable.

According to the method for forming a pattern, which comprises step (a) to step (c), it is possible to provide a substrate having a pre-pattern, which has a sacrificial layer made of a first material partially or totally formed on a surface thereof, wherein the sacrificial layer comprises pattern grooves, which is directly processed to form a line by using a first means, are free from the first material and have a line width of a first resolution or lower, the pattern grooves are filled with a second material to a second resolution by using a second means.

Hereinafter, materials for use in the method for forming a pattern according to the present invention, or materials used in each constitutional element of the substrate having a pre-pattern will be explained in more detail.

(1) Material for Substrate

Materials for the substrate include materials currently used in substrates for patterning, with no particular limitation. Non-limiting examples of the materials include polyethylene terephthalate (PET), polyester (PE), polycarbonate (PC), polypropylene (PP), acryl, amorphous glass or a combination of PC/PE.

(2) First Material for Forming Sacrificial Layer

The first material may be a single material or a mixture of at least two kinds of materials.

There is no particular limitation in the first material that may be used in the present invention to form the sacrificial layer, as long as it is present in a solid or gel state, after it dries or experiences a phase change at room temperature. Preferably, the first material for forming the sacrificial layer is removed easily by the first means such as focused energy beams to a high resolution. More preferably, the first material is one that is vaporized or decomposed with ease by the irradiation of focused energy beams. When the first material is removed by thermal decomposition/vaporization, it is preferable that the first material has low specific heat and latent heat so as to be removed with ease even when using the focused energy beams with low power/energy density.

Additionally, it is preferable that the first material evaporates at a temperature as low as possible, and is dissolved with ease in a solution that cannot dissolve the second material for forming the pattern, such as a functional material.

Particular non-limiting examples of the first material for forming the sacrificial layer, which is a polymer material decomposed by the irradiation of laser, etc. include polypropylene carbonate, poly(alpha-methylstyrene), polymethylmethacrylate, polybutylmethacrylate, cellulose acetate, nitrocellulose, polyvinylchloride, polyacetal, polyvinylidene chloride, polyurethane, polyester, polyorthoester, polyacrylonitrile, modified acrylonitrile resin, maleic acid resin, copolymers thereof, mixtures thereof, or the like.

In addition, non-limiting examples of the first material, which is vaporized/evaporated by itself under the irradiation of laser, etc. or is vaporized/evaporated in the presence of an additive that absorbs light in a specific wavelength range, include acetamide, 2-aminopyridine, 2-amino-3-methylpyridine, 2-amino-6-methylpyridine, 2-chloropyridine, 3-bromopyridine, 3-cyanopyridine, 4-cyanopyridine, 1,3-di-(4-piperidyl)propane, diethanolamine, diisopropanolamine, 2-ethanolpiperidine, ethylenediamine tetraacetic acid, isobutanolamine, N-methylacetamide, p-toluidine, triisopropanolamine, N-vinyl-2-caprolactam, maleic acid, pivalic acid, trichloroacetic acid, behenyl alcohol, 2,3-butanediol, butynediol, cyclohexanol, 2,2-dimethylpropanol, 1,6-hexanediol, 1-heptanol, bornyl acetate, cetyl acetate, ethylene carbonate, methyl behenate, diphenyl ether, n-hexyl ether, 1,3,4-trioxane, 3-ethoxy-1-propanol, benzophenone, p-methylacetophenone, phenylacetone, catechol, p-cresol, hydroquinone, 4-ethylphenol, 2-methoxyphenol, phenol, thymol, 2,3-xylenol, 2,5-xylenol and mixtures thereof.

In addition to the aforementioned examples, any organic or inorganic materials that can be removed with ease by focused energy beams may be used as the first material for forming the sacrificial layer in the scope of the present invention.

For example, suitable additives may be added to the sacrificial layer in order to control the adhesion between the sacrificial layer and the substrate or between the sacrificial layer and the second material for forming a pattern; to enhance patterning capability; to maintain sufficient wettability with the second material for forming a pattern; to control softness and adhesive property of the first material for forming the sacrificial layer; or to improve absorption of focused energy beams.

Particular examples of the additive for improving absortion of focused energy beams include diazoalkyl, diazonium salts, azido compounds, ammonium salts, oxides, carbonates, peroxides or mixtures thereof. In the case of focused energy beams with a wavelength in the IR range, it is possible to use any one additive selected from the group consisting of substituted polyphthalocyanine compounds, metal-containing phthalocyanine compounds, cyanine dyes, squarylium dyes, chalcogenopyriloacrylidene dyes, chromate dyes, metal thiolate dyes, bis(chalcogenopyrilo)polymethine dyes, oxyindolyzine dyes, bis(aminoaryl)polymethine dyes, merocyanine dyes, quinoide dyes and mixtures thereof. Also, it is possible to use an inorganic material selected from the group consisting of transition metal elements, elements that belong to Groups IIIa, IVa, Va, VIa, VIII, IIIb and Vb in the Periodic Table, and mixtures thereof. Elements that belong to Group IVb, including carbon, may be used. Selection of the wavelength of focused energy beams depends on selection of the first material for forming the sacrificial layer or the absorbing agent.

Meanwhile, particular examples of the softening agent that may be used in the present invention include, but are not limited to: diphenyl phthalate derivatives, such as diphenyl phthalate or di-(2-ethylhexyl)phthalate; ricinoleic acid derivatives, such as butyl ricinolate or propylene glycol ricinolate; sebacic acid derivatives, such as dibutyl sebacate or dimethyl sebacate; stearic acid derivatives, such as n-butyl stearate or propylene glycol monostearate; succinic acid derivatives, such as diethyl succinate; sulfonic acid derivatives, such as N-ethyl-o, p-toluene-sulfonamide; phosphoric acid derivatives, such as tricresyl phosphate or tributyl phosphate; paraffin derivatives, such as chloroparaffin; palmitic acid derivatives, such as isopropyl palmitate or methyl palmitate; oleic acid derivatives, such as butyl oleate or glycerol trioleate; myristic acid derivatives, such as isopropyl myristate; melitates, such as tricapryl trimelitate or triisodecyl trimelitate; maleic acid derivatives, such as di-n-butyl maleate or di-(2-ethylhexyl)maleate; linolenic acid derivatives such as methyl linolate; lauric acid derivatives such as methyl laurate; isophthalic acid derivatives, such as diphenyl isophthalate or dimethyl isophthalate; 2,2,4-trimethyl-1,3-pentanediol; isobutyrate derivatives, such as diisobutyrate; glycerol derivatives, such as glycerol triacetate; fumaric acid derivatives, such as dibutyl fumarate; epoxy derivatives, such as n-octyl epoxystearate; citric acid derivatives, such as tri-n-butyl citrate or acetyltriethyl citrate; benzoic acid derivatives, such as diethyleneglycol dibenzoate or dipropyleneglycol dibenzoate; azelaic acid derivatives, such as diisodecyl azelate or dimethyl azelate; and adipic acid derivatives, such as dicapryl adipate or diisodecyl adipate.

(3) Second Material for Forming Pattern

The second material may be a single material or a mixture of at least two kinds of materials.

Although there is no particular limitation in the second material for forming a pattern according to the present invention, it is preferable to use a functional material, for example, a material used to form electrode wires, pixels or thin film transistors in electronic devices.

Particular examples of the second material include: conductive polymers, metal nanoparticles, organometallic compounds, LCD materials (e.g. a black matrix, spacer, color filter, or the like), OLED/PLED materials (e.g. a black matrix, light emitting layer, electron transporting layer, hole transporting layer, or the like), inorganic EL materials, organic/inorganic TFT materials, or the like.

The conductive polymer that can be used as the second material for forming a pattern is a polymer that has mechanical properties specific to polymers and experiences a transition into a semiconductor or conductor via chemical doping. Recently, such conductive polymers have been used in the field of subsistence goods and advanced industrial materials, for example in a secondary battery, an anti-electrostatic agent, a switching device, a non-linear device, capacitor, an optical recording material, a material for protecting electromagnetic waves, or the like.

Particular non-limiting examples of the conductive polymer include polythiophene, poly(3-alkylthiophene), PEDOT/PSS, polyaniline, polyaniline derivatives, polyacetylene, polypyrrole, polypyrrole derivatives, polyphenylene, polyphenylene sulfide, polyphenylenevinylene, polyfuran or mixtures thereof. However, there is no particular limitation in the conductive polymer, as long as it shows conductivity.

Also, there is no particular limitation in the metal nanoparticles, as long as they are currently used in the art. Particular examples of the metal nanoparticles include nanoparticles of silver, gold, platinum, palladium, copper, nickel, zinc, iron, aluminum or a mixture thereof.

Non-limiting examples of the organometallic compound that may be used as the second material for forming a pattern according to the present invention include organometallic compounds present in a solid phase at room temperature, such as biscyclopentadienyl magnesium, dicyclopentadienyl manganese, bismethylcyclopentadienyl magnesium, acetylacetone strontium, biscyclopentadienyl strontium, dimethoxystrontium, trimethylindium, dimethoxybarium, acetylacetone barium, biscyclopentadienylbarium, trimethoxylanthanum, acetylacetone lanthanum, triscyclopentadienyl lanthanum, trismethylcyclopentadienyl lanthanum, trimethoxy yttrium, triscyclopentadienyl yttrium, or mixtures thereof.

The organic light emitting material used in organic electroluminescence devices may be any light emitting compound currently used in the art with no particular limitation. Particular examples of the organic light emitting compound include tri(8-hydroxyquinoline)aluminum(III) (Alq3), Alq3 derivatives, poly(1,4-phenylenevinylene)(ppv), and PPV derivatives, such as poly-(2-methoxy-5-(2'-ethylhexyloxy)-1,4-phenylenevinylene) (MEH-PPV), or the like.

Additionally, the inorganic light emitting material used in inorganic electroluminescence devices may be any light emitting compound currently used in the art with no particular limitation. Particular examples of the inorganic light emitting compound include: GaAs-based phosphors, AlGaInP-based phosphors, AlInGaN-based phosphors, GaN-based phosphors and mixtures thereof.

Non-limiting examples of the organic/inorganic TFT materials include: amorphous silicon, polycrystalline silicon; p-type organic substances, such as pentacene, dithiaanthracene, dialkyldithiaanthracene, bis(dithienothiophene), benzodithiophene derivatives, oligothiophene, phenylene, or arylene; n-type organic substances, such as perylene, pentacene, quinodimethane, phthalocyanine, or tetracarboxylic anhydride; soluble oligmeric and polymeric OTFT materials; and insulators, such as polyimide, soluble polyimide, benzocyclobutene, poly(vinylphenol) or PMMA.

Meanwhile, suitable additives may be added to the second material for forming a pattern in order to control the physical/chemical properties suitable for patterning. As used herein, the term "additive" means a chemical other than the second material, which is added to modify the physicochemical properties as necessary. Such additives are generally added in a small amount.

(4) Material for Protective Layer

According to a preferred embodiment of the present invention, a protective layer may be further applied after the application of the first material onto the substrate or the application of the second material (e.g. functional material).

The protective layer may be removed by washing it with a water soluble solution or a water insoluble solution. When washing the protective layer with a water soluble solution, water soluble polymers, such as polyvinyl alcohol, polyvinylpyrrolidone or ethyl cellulose, are used. On the other hand, when washing the protective layer with a water insoluble solution, water insoluble polymers such as PMMA may be used.

The protective layer and the solution used to remove the protective layer should be selected so as to prevent the preliminarily applied second material for forming a pattern (e.g. functional material) from being damaged by both of the protective layer and the solution.

BRIEF DESCRIPTION OF THE DRAWINGS

The foregoing and other objects, features and advantages of the present invention will become more apparent from the following detailed description when taken in conjunction with the accompanying drawings in which:

FIG. 2 is a schematic flow chart for a method for forming a pattern by a conventional laser patterning process;

BEST MODE FOR CARRYING OUT THE INVENTION

Reference will now be made in detail to the preferred embodiments of the present invention. It is to be understood that the following examples are illustrative only and the present invention is not limited thereto.

EXAMPLE 1

In this example, a non-polar material was used as functional material ink containing no particles dispersed therein, and a polar material was used as a sacrificial layer material to provide little or no solubility between the functional material and the sacrificial layer.

Figure 1:
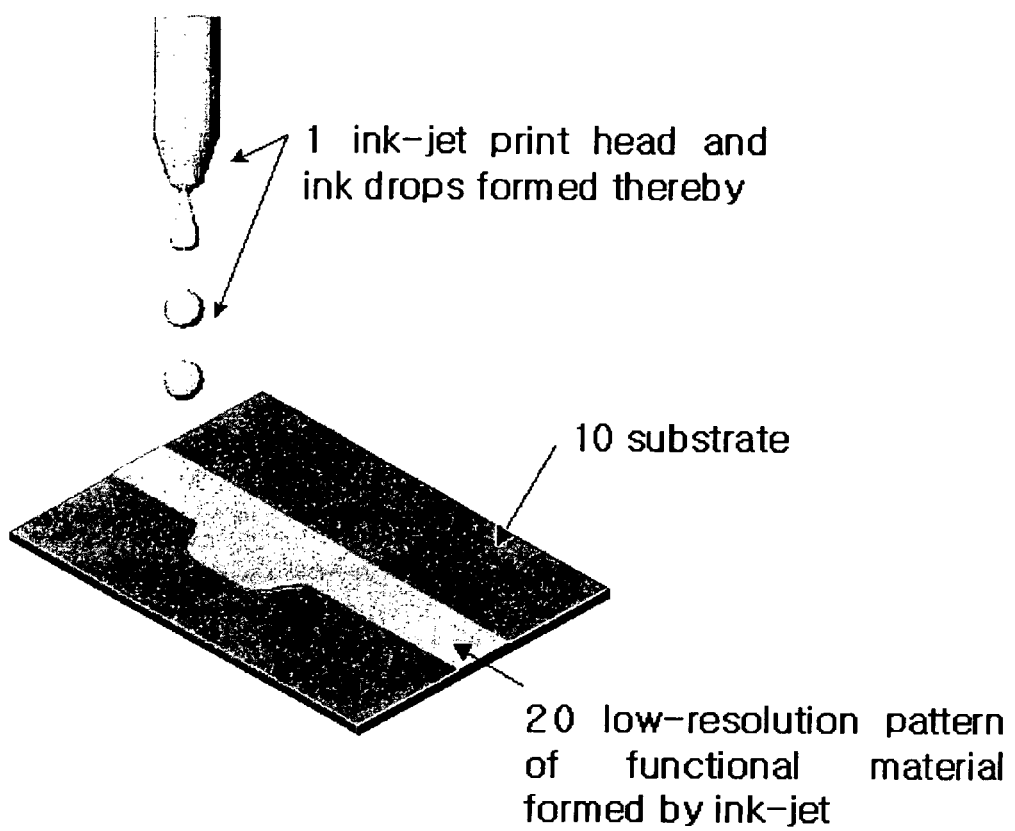
FIG. 1 is a schematic flow chart for a method for forming a pattern by a conventional ink-jet patterning process.
Figure 3:
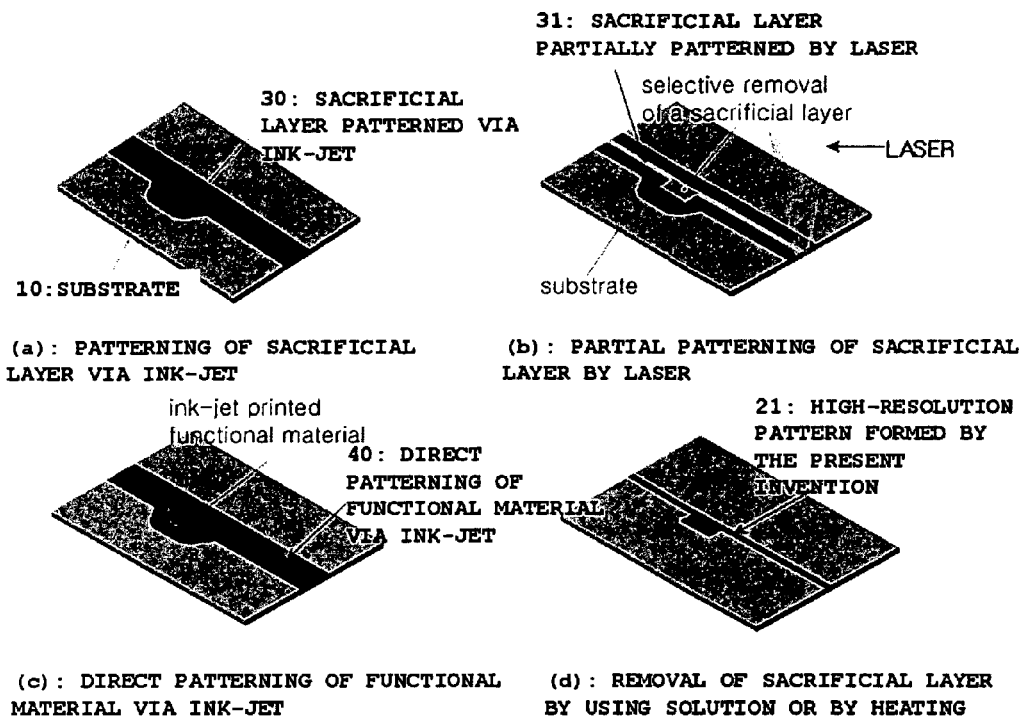
FIG. 3 is a schematic flow chart for a method for forming a pattern according to a preferred embodiment of the present invention.
Figure 4:
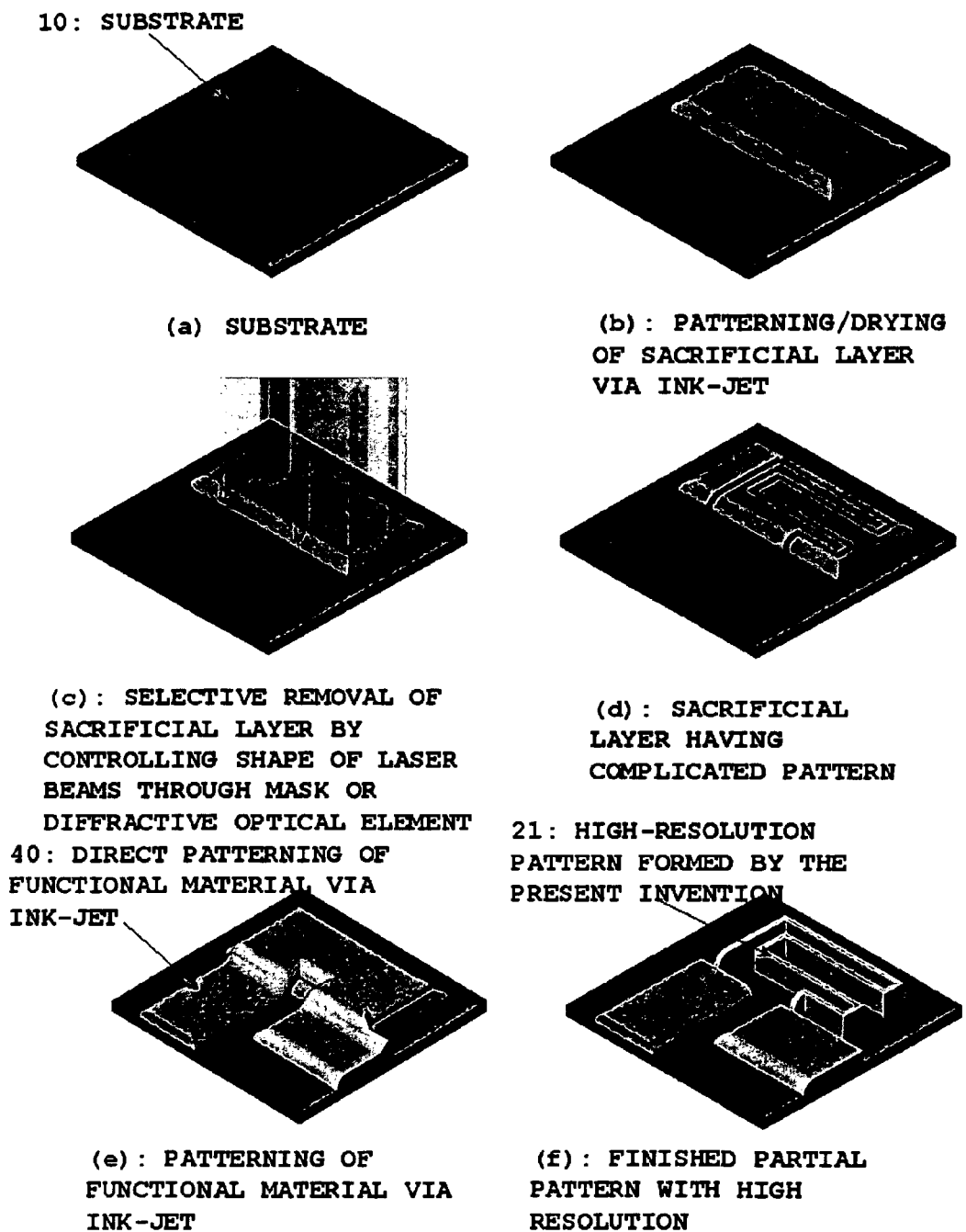
FIG. 4 is a schematic flow chart for a method for partially forming a high-resolution pattern according to a preferred embodiment of the present invention.
Figure 5:
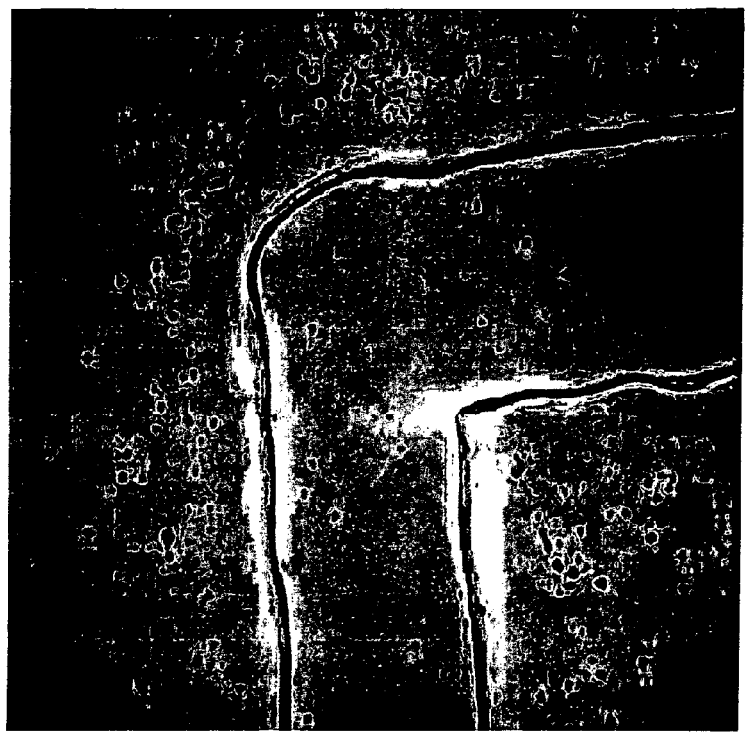
FIG. 5 and FIG. 6 are views, each showing how to remove the portions, to which a material for forming a pattern is applied by way of laser, when using a low-molecular weight material and a high-molecular weight material, respectively, as a material for sacrificial layer.
Figure 9:
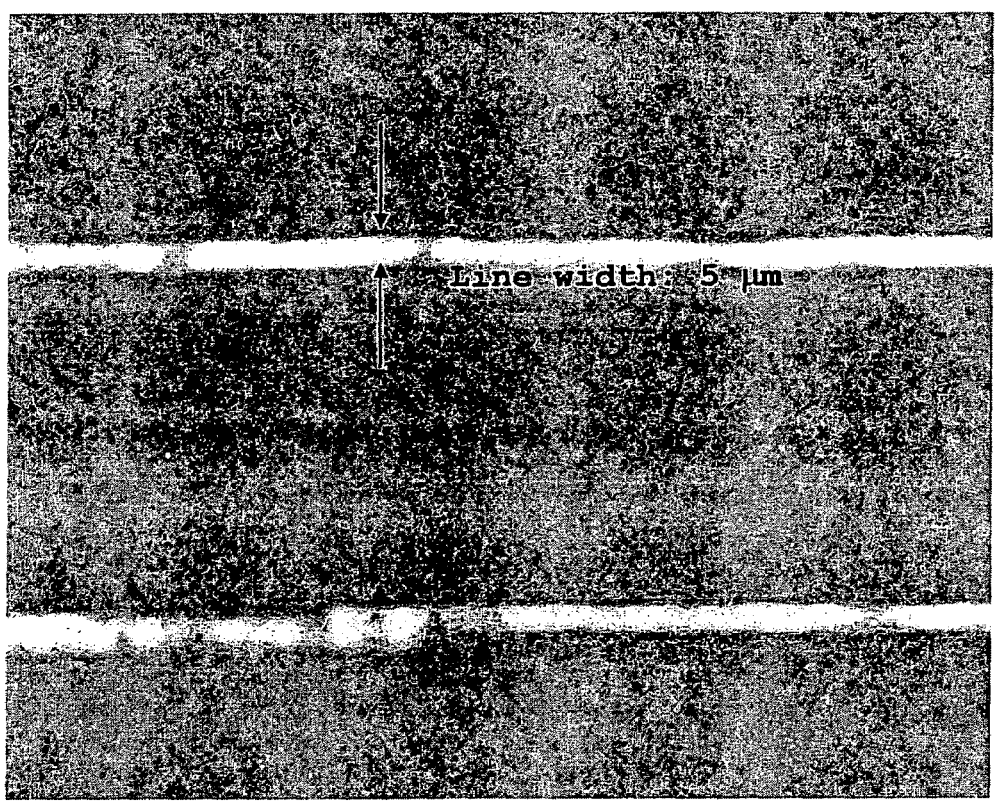
FIG. 9 is a photographic view showing the pattern before removing the sacrificial layer and undesired functional materials, which is taken as experimental data for demonstrating the minimum line width available from the method according to the present invention.

First, to provide a composition for forming a sacrificial layer, 1.5 g of polyvinylalcohol (weight average molecular weight: 7,200, Fluka, 81368) and 0.5 g of a UV absorbing agent (black dye, LC Chem.) were dissolved in 15 g of water, 1 g of ethyleneglycol, and 0.5 g of glycerol to form ink for ink-jet. Next, the ink is applied onto a glass substrate by using an ink-jet device (JetLab, MicroFab) to form the pattern of a sacrificial layer with a width of 600 µm. Then, the pattern of the sacrificial layer was partially removed by UV laser (355 nm, Avia 2000, Coherent Inc.) with a beam diameter of 30 µm to form regions to be patterned subsequently by a functional layer. The laser was operated under the conditions of a distance of 7.4 mm, a frequency of 30 kHz, a beam power of 60% and a scanning rate of 0.1 m/s. The pattern grooves formed by partially removing the sacrificial layer is shown in FIG. 5 at a magnification of 100×. In FIG. 5, the pattern formed by removing the sacrificial layer has a width of about 30 µm that is similar to beam width. Next, xylene containing silver neodecanoate ($C_{10}H_{19}AgO_2$, CAS No. 68683-18-1) dissolved therein (30 wt % of silver neodecanoate in xylene) was jetted, as ink containing no particles, to fill the regions free from the sacrificial layer with the ink. After the completion of the jetting, the patterned glass substrate was dried for about 1 hour and sintered on a hot plate at 150☐ for 10 minutes. Then, the sintered glass substrate was washed with distilled water at 80☐ for 30 minutes to remove the sacrificial layer. The electrode obtained by the above patterning method showed a specific resistance of about 25 µΩ·cm. As can be seen from FIG. 9, the minimum line width realized by the same method as Example 1 is about 5 µm.

EXAMPLE 2

In this example, a polar material was used as functional material ink containing particles dispersed therein, and a non-polar material was used as a sacrificial layer material to provide little or no solubility between the functional material and the sacrificial layer.

Figure 6:
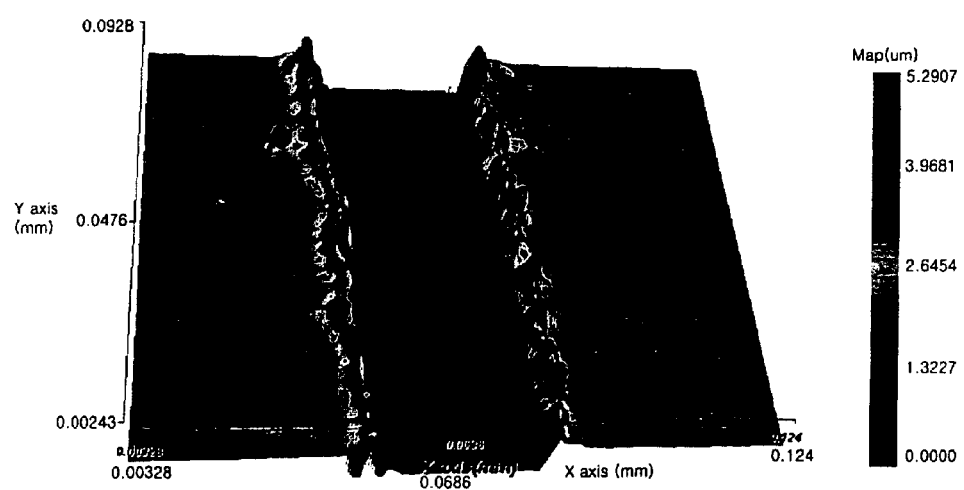
Figure 7:
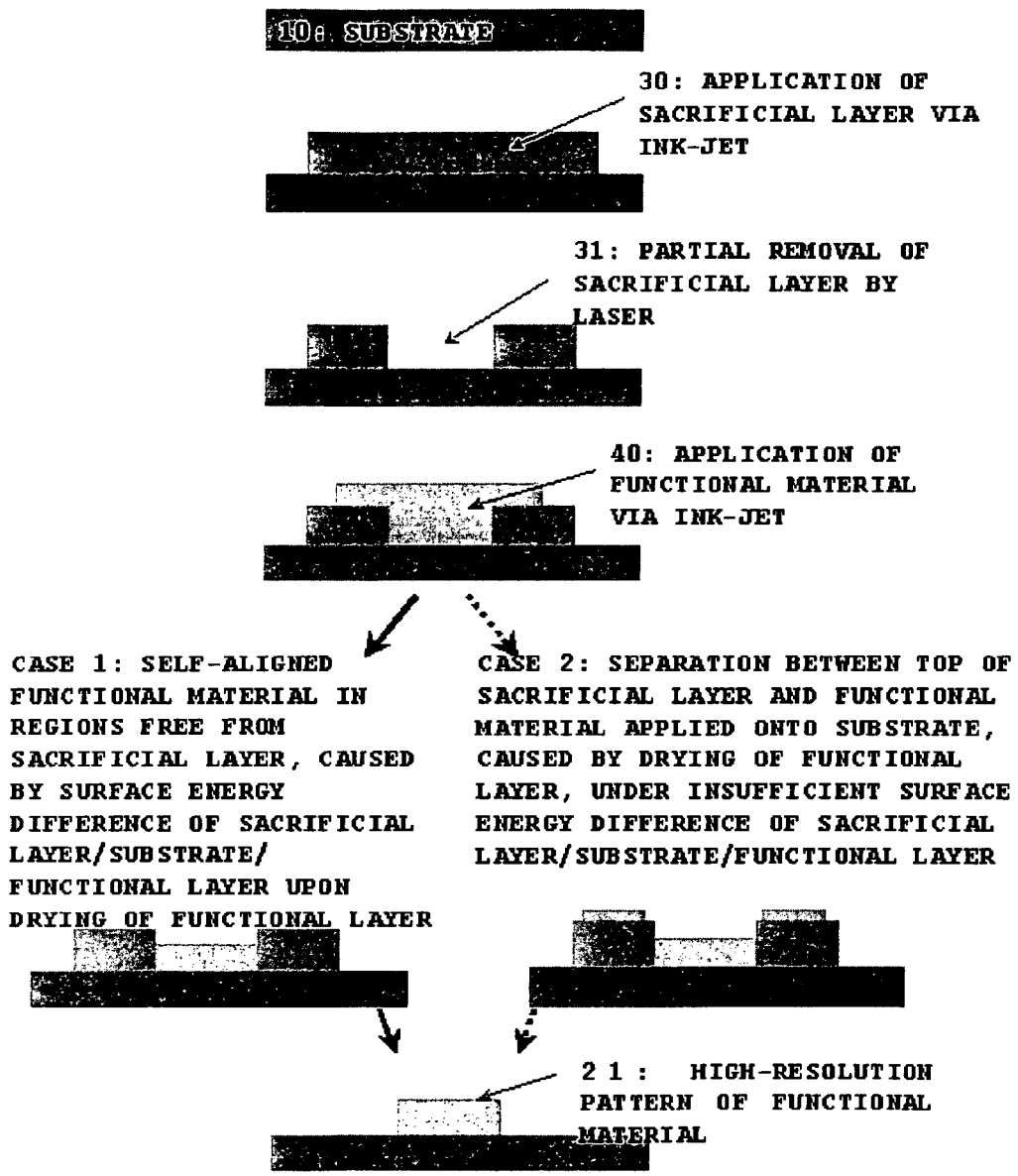
FIG. 7 and FIG. 8 are flow charts, which illustrate embodiments using a low-molecular weight material and a high-molecular weight material, respectively, as a material for forming a sacrificial layer.
Figure 8:
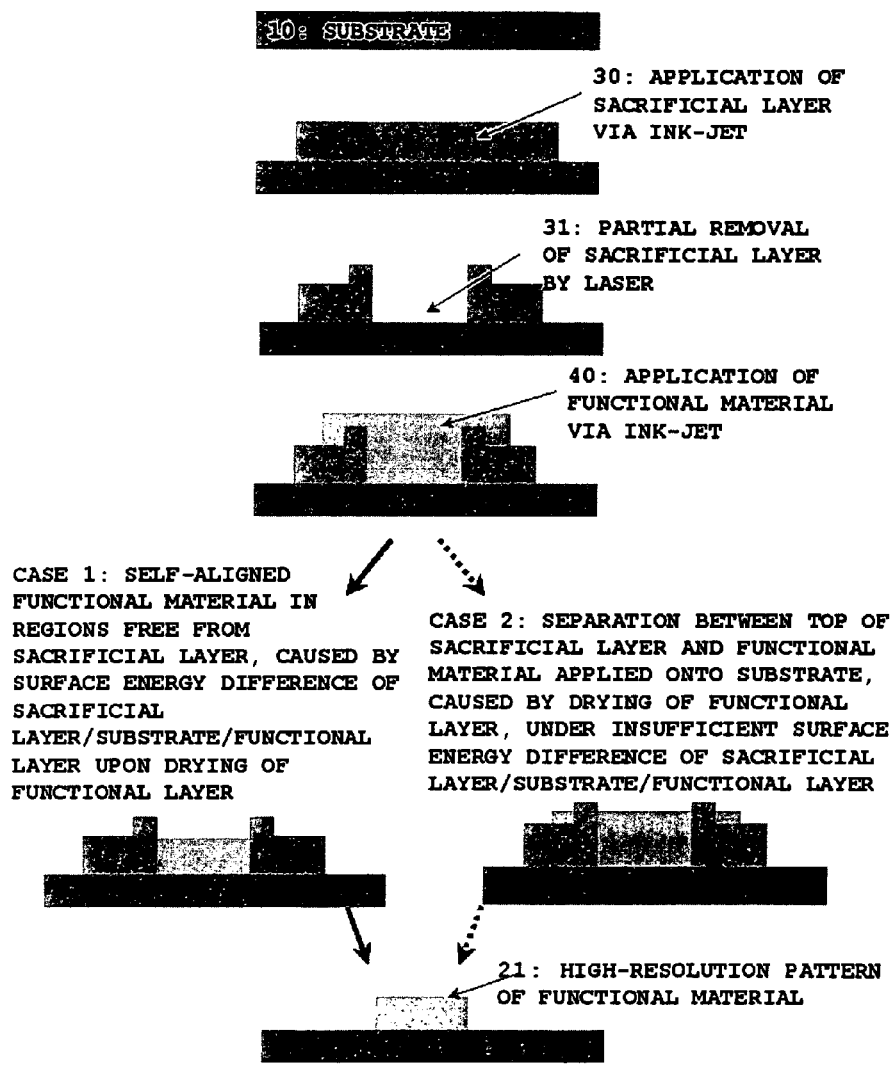

First, to provide a composition for forming a sacrificial layer, 5 g of PMMA (weight average molecular weight: 50,000, Fluka, CAS No. 9011-14-7) and 1.5 g of a UV absorbing agent (black dye, LC Chem.) were dissolved in 1,2-Dichloroethane(Molecular weight: 98.96, CAS No. 107-06-2) to form ink for ink-jet. Next, the ink is applied onto a glass substrate by using an ink-jet device (JetLab, MicroFab) to form the pattern of a sacrificial layer with a width of 500 µm. Then, the pattern of the sacrificial layer was partially removed by UV laser (355 nm, Avia 2000, Coherent Inc.) with a beam diameter of 30 µM to form regions to be patterned subsequently by a functional layer. The laser was operated under the conditions of a distance of 7.4 mm, a frequency of 30 kHz, a beam power of 70% and a scanning rate of 0.1 m/s. The pattern grooves formed by partially removing the sacrificial layer is shown in FIG. 6 at a magnification of 100×. In FIG. 6, the pattern formed by removing the sacrificial layer has a width of about 30 µm that is similar to beam width. Next, ink containing dispersed silver nano particle(silver nano ink, LG chem.) was jetted onto the pattern of the sacrificial layer by using ink-jet. After the completion of the jetting, the patterned glass substrate was dried. The dried silver nano ink was sintered on a hot plate at 200☐ for 20 minutes and washed with 1,2-dichloroethane to remove the sacrificial layer. The electrode obtained by the above patterning method showed a specific resistance of about 15 µΩ·cm.

INDUSTRIAL APPLICABILITY

As can be seen from the foregoing, the method for forming a pattern according to the present invention comprises simple processing steps that avoid the need for an expensive large-area mask conventionally used in lithography, minimizes consumption of a functional material, and provides a pattern with a higher resolution compared to a conventional patterning method based on ink-jet. Therefore, the method according to the present invention is cost-efficient and prevents deterioration of the functional material due to laser irradiation. Additionally, it is possible to select focused energy beams suitable for the particular type of a material for forming a sacrificial layer, applied onto a substrate, Hence, it is possible to manufacture a substrate having a high-resolution pattern with high efficiency.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

The invention claimed is:

1. A method for forming a pattern which comprises the steps of:
   (a) providing a substrate having a sacrificial layer made of a first material, partially or totally formed on the substrate;
   (b) forming pattern grooves, which are free from the first material and have a line width of a first resolution or lower, on the sacrificial layer by using a first means of irradiation of focused energy beam;
   (c) filling the pattern grooves with a second material to a second resolution, which is lower than the line width of the pattern grooves formed in step (b), by using a second means of ink-jet, to form a pattern of the second material on the substrate.

2. The method according to claim 1, which further comprises step (d) of removing the remaining sacrificial layer after step (c).

3. The method according to claim 1, wherein an additional pattern made of the second material is additionally formed on regions free from the sacrificial layer to the second resolution or to a third resolution different from the second resolution by using the second means, in step (c), while the pattern grooves are filled with the second material to the second resolution.

4. The method according to claim 1, wherein the sacrificial layer is patterned in step (a) by using a third means equal to or different from the second means to a fourth resolution different from the resolution of the pattern grooves to be formed.

5. The method according to claim 1, wherein the first means used to remove the sacrificial layer for forming pattern grooves in step (b) is focused energy beam, and a mask or a diffractive optical element is used to control a shape of the focused energy beam.

6. The method according to claim 1, wherein a mask or a diffractive optical element with a fifth resolution higher than the first resolution is used to form pattern grooves with the fifth resolution or lower, when removing the sacrificial layer by the first means with the first resolution or lower in step (b), and then the pattern grooves are filled with the second material by using the second means in step (c) to the second resolution lower than the fifth resolution.

7. The method according to claim 1, wherein the sacrificial layer made of the first material is formed on a substrate including previously patterned regions.

8. The method according to claim 1, which further comprises: a step of forming a protective layer on the top of the sacrificial layer, after step (a) of forming the sacrificial layer, and removing the protective layer after step (b); or a step of forming a protective layer on the top of the second material layer for forming a pattern, after step (c) of applying the second material, and removing the protective layer after step (d).

9. The method according to claim 2, wherein the second material applied onto a top of the sacrificial layer is removed in step (d) simultaneously with the removal of the remaining sacrificial layer.

10. The method according to claim 2, wherein step (d) is performed as a wet process for removing the sacrificial layer by using a solvent or a solution, or as a dry process for removing the sacrificial layer without using a solvent or a solution.

11. A substrate having a pre-pattern, which has a sacrificial layer made of a first material partially or totally formed on a surface thereof,
wherein the sacrificial layer comprises pattern grooves, which is directly processed to form a line by using a first means of irradiation of focused energy beam, are free from the first material and have a line width of a first resolution or lower, the pattern grooves are filled with a second material to a second resolution, which is lower than the line width of the pattern grooves, by using a second means of ink-jet.

12. The substrate according to claim 11, wherein the pattern grooves in regions having the sacrificial layer, are filled with the second material to the second resolution, and an additional pattern made of the second material is formed in regions free from the sacrificial layer to the second resolution or to a third resolution different from the second resolution.

13. The substrate according to claim 11, wherein the sacrificial layer remaining on the substrate is removed from the substrate.

14. The substrate according to claim 11, wherein the sacrificial layer made of the first material is formed on the substrate including previously patterned regions.

15. The substrate according to claim 11, wherein the sacrificial layer is patterned on the substrate to a fourth resolution different from the resolution of the pattern grooves formed on the sacrificial layer.

16. The substrate according to claim 11, which further comprises a protective layer that prevents the first material for forming the sacrificial layer, or the second material for forming a pattern, remaining on a top of the sacrificial layer along with the first material, form adhering back to patterned regions or the substrate after removal of the first material or the second material.

* * * * *